(12) United States Patent
Shao et al.

(10) Patent No.: US 9,023,438 B2
(45) Date of Patent: *May 5, 2015

(54) METHODS AND APPARATUS FOR COMBINATORIAL PECVD OR PEALD

(71) Applicant: Intermolecular, Inc., San Jose, CA (US)

(72) Inventors: ShouQian Shao, Fremont, CA (US); Chi-I Lang, Cupertino, CA (US); Jingang Su, Cupertino, CA (US)

(73) Assignee: Intermolecular, Inc., San Jose, CA (US)

(*) Notice: Subject to any disclaimer, the term of this patent is extended or adjusted under 35 U.S.C. 154(b) by 185 days.

This patent is subject to a terminal disclaimer.

(21) Appl. No.: 13/716,829

(22) Filed: Dec. 17, 2012

(65) Prior Publication Data

US 2014/0170335 A1    Jun. 19, 2014

(51) Int. Cl.
 *H05H 1/24* (2006.01)
 *C23C 16/04* (2006.01)
 *C23C 16/455* (2006.01)
 *C23C 16/50* (2006.01)
 *C23C 16/52* (2006.01)

(52) U.S. Cl.
 CPC ......... *C23C 16/042* (2013.01); *C23C 16/45536* (2013.01); *C23C 16/50* (2013.01)

(58) Field of Classification Search
 CPC .............. C23C 16/44; C23C 16/45525; C23C 16/45568; C23C 16/5096; C23C 16/509; C23C 16/4586; C23C 16/45536; C23C 16/0227; C23C 16/45548; C23C 16/45523
 USPC ...................................................... 427/8, 569
 See application file for complete search history.

(56) References Cited

U.S. PATENT DOCUMENTS

| | | | |
|---|---|---|---|
| 8,334,015 B2 | 12/2012 | Chiang et al. | |
| 2005/0022735 A1 | 2/2005 | Breitung et al. | |
| 2009/0061108 A1* | 3/2009 | Endo et al. | 427/569 |
| 2009/0068849 A1* | 3/2009 | Endo et al. | 438/763 |
| 2011/0244690 A1* | 10/2011 | Shanker et al. | 438/703 |
| 2013/0153536 A1* | 6/2013 | Shao et al. | 216/59 |

* cited by examiner

Primary Examiner — Kelly M Gambetta (57) ABSTRACT

Apparatus and methods for depositing materials on a plurality of site-isolated regions on a substrate are provided. The deposition uses PECVD or PEALD. The apparatus include an inner chamber with an aperture and barrier that can be used to isolate the regions during the deposition and prevent the remaining portions of the substrate from being exposed to the deposition process. The process parameters for the deposition process are varied among the site-isolate regions in a combinatorial manner.

20 Claims, 6 Drawing Sheets

METHODS AND APPARATUS FOR COMBINATORIAL PECVD OR PEALD

TECHNICAL FIELD

The present disclosure relates generally to methods and apparatuses for processing using a plasma source for surface treatment and layer formation.

BACKGROUND

Plasmas are widely used for a variety of treatment and layer deposition tasks in semiconductor fabrication and other thin film applications. These applications include subtractive processes such as wafer precleaning, contaminant removal, native oxide removal, photoresist removal, plasma etching, as well as treatment processes such as oxidation, nitridation, or hydridation of a layer both during and after formation, and deposition process such as plasma enhanced chemical vapor deposition (PECVD) or plasma enhanced atomic layer deposition (PEALD). "Remote" plasma sources are frequently used, where the plasma is located at some distance from the surface to be treated or substrate on which a layer is being formed. The distance allows some filtering of the charged particles in the plasma. For example, the density of electrons and ions can be adjusted or removed from the generated plasma. "Direct" plasma sources are also used where the substrate is exposed to the plasma.

Heretofore, plasma sources have been used to provide uniform exposure for entire substrates, and experimental studies of process variables have required dedicating an entire wafer to each process condition to be tested. What is needed is a system that allows systematic exploration of process variables in a combinatorial manner with many variations on a single substrate, especially for PECVD and PEALD applications. The most promising process parameters can then be extended to the processing of entire substrates.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Methods and apparatus for depositing materials using PECVD or PEALD are disclosed. The apparatus includes an outer chamber, a plasma source, and an inner chamber enclosing a substrate support. The inner chamber has a top surface parallel to the surface of the substrate support, a bottom surface parallel to the top surface and disposed below the substrate support, and one or more side walls. An aperture is disposed in the top surface of the inner chamber and is operable to provide site-isolated exposure of plasma from the plasma source to a site-isolated region on a substrate. The aperture is disposed between the plasma source and the substrate and has an area less than that of the substrate. A barrier can be positioned near the edges of the aperture, extending down from the top surface of the inner chamber toward the substrate, and separated from the substrate by a small gap, typically less than about 0.5 mm. The barrier can define the boundaries of the site-isolated region on the substrate. A gas purge system can be provided from a plurality of flow outlets at the edge of the substrate support. The gas purge system can provide a gas flow into the site-isolated region through the small gap and out of the site-isolated region through the aperture. A substrate heater can be mounted in the substrate support. A transport system moves the substrate support and is capable of positioning the substrate such that the site-isolated region can be located anywhere on the substrate.

Methods of depositing materials on a plurality of site-isolated regions using PECVD or PEALD are provided. The methods comprise depositing material using PECVD or PEALD on a first site-isolated region of a surface under a first set of process parameters, depositing material using PECVD or PEALD on a second site-isolated region of the surface of the substrate under a second set of process parameters, and varying the first set and second set of process parameters in a combinatorial manner. The first set and second set of process parameters include one or more of source gases for the plasma generator, plasma filtering parameters, exposure time, gas flow rate, frequency, plasma generator power, plasma generation method, chamber pressure, substrate temperature, distance between plasma source and substrate, substrate bias voltage, or combinations thereof. The depositing can be controlled by an aperture in a plate disposed between the plasma source and the substrate. The aperture has an area less than that of the substrate. The depositing can be further controlled by placing a barrier near the edges of the aperture, wherein the barrier extends from the aperture plate to the substrate surface and is separated by a small gap from the substrate surface. The depositing can also be controlled by a gas purge system that provides a flow of gas into the site-isolated region through the small gap and out of the site-isolated region through the aperture.

The method can be extended by depositing material using PECVD or PEALD on a third site-isolated region of the substrate under a third set of process parameters, and more generally, by depositing material using PECVD or PEALD on a plurality of site-isolated regions of the substrate under a plurality of different sets of process parameters. The substrate can be analyzed to evaluate the effect of the different process parameters on the substrate. Plasma deposition process parameters can be varied in a combinatorial manner. Plasma deposition process parameters include one or more of source gases for the plasma generator, plasma filtering parameters, exposure time, gas flow rate, frequency, plasma generator power, plasma generation method, chamber pressure, substrate temperature, distance between plasma source and substrate, substrate bias voltage, or combinations thereof.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Before various embodiments are described in detail, it is to be understood that unless otherwise indicated, this invention is not limited to specific layer compositions or surface treatments. It is also to be understood that the terminology used herein is for the purpose of describing particular embodiments only and is not intended to limit the scope of the present invention.

It must be noted that as used herein and in the claims, the singular forms "a," "and" and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. The term "about" generally refers to ±10% of a stated value.

The term "site-isolated" as used herein refers to providing distinct processing conditions, such as controlled temperature, flow rates, chamber pressure, processing time, plasma composition, and plasma energies. Site isolation may provide complete isolation between regions or relative isolation between regions. Preferably, the relative isolation is sufficient to provide a control over processing conditions within ±10%, within ±5%, within ±2%, within ±1%, or within ±0.1% of the target conditions. Where one region is processed at a time, adjacent regions are generally protected from any exposure that would alter the substrate surface in a measurable way.

The term "site-isolated region" is used herein to refer to a localized area on a substrate which is, was, or is intended to be used for processing or formation of a selected material. The region can include one region and/or a series of regular or periodic regions predefined on the substrate. The region may have any convenient shape, e.g., circular, rectangular, elliptical, wedge-shaped, etc. In the semiconductor field, a region may be, for example, a test structure, single die, multiple dies, portion of a die, other defined portion of substrate, or an undefined area of a substrate, e.g., blanket substrate which is defined through the processing.

The term "substrate" as used herein may refer to any workpiece on which formation or treatment of material layers is desired. Substrates may include, without limitation, silicon, silica, sapphire, zinc oxide, SiC, AlN, GaN, Spinel, coated silicon, silicon on oxide, silicon carbide on oxide, glass, gallium nitride, indium nitride and aluminum nitride, and combinations (or alloys) thereof. The term "substrate" or "wafer" may be used interchangeably herein. Semiconductor wafer shapes and sizes can vary and include commonly used round wafers of 2", 4", 200 mm, or 300 mm in diameter.

The term "remote plasma source" as used herein refers to a plasma (e.g., an rf or microwave generated plasma) located at a distance from a deposition or treatment location sufficient to allow some filtering of the plasma components. For example, the density of ions and electrons can be adjusted by distance, and electrons and ions can also be filtered out using suitable electrode configurations, such as a grounded metal showerhead so that only atomic or molecular radicals reach the substrate.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD).

The present invention is described in one or more embodiments in the following description with reference to the Figures, in which like numerals represent the same or similar elements. While the invention is described in exemplary terms which include a best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Embodiments of the present invention provide a system for systematic exploration of plasma treatment process variables in a combinatorial manner with the possibility of performing many variations on a single substrate. The combinatorial processing permits a single substrate to be systematically explored using different plasma processing conditions, and reduces or eliminates variables that interfere with research quality. The apparatuses and methods disclosed herein permit the systematic exploration of plasma treatments on a single substrate using combinatorial methods, and removes the run to run variability and inconsistencies between substrates that hamper research and optimization of process variables.

Figure 1:
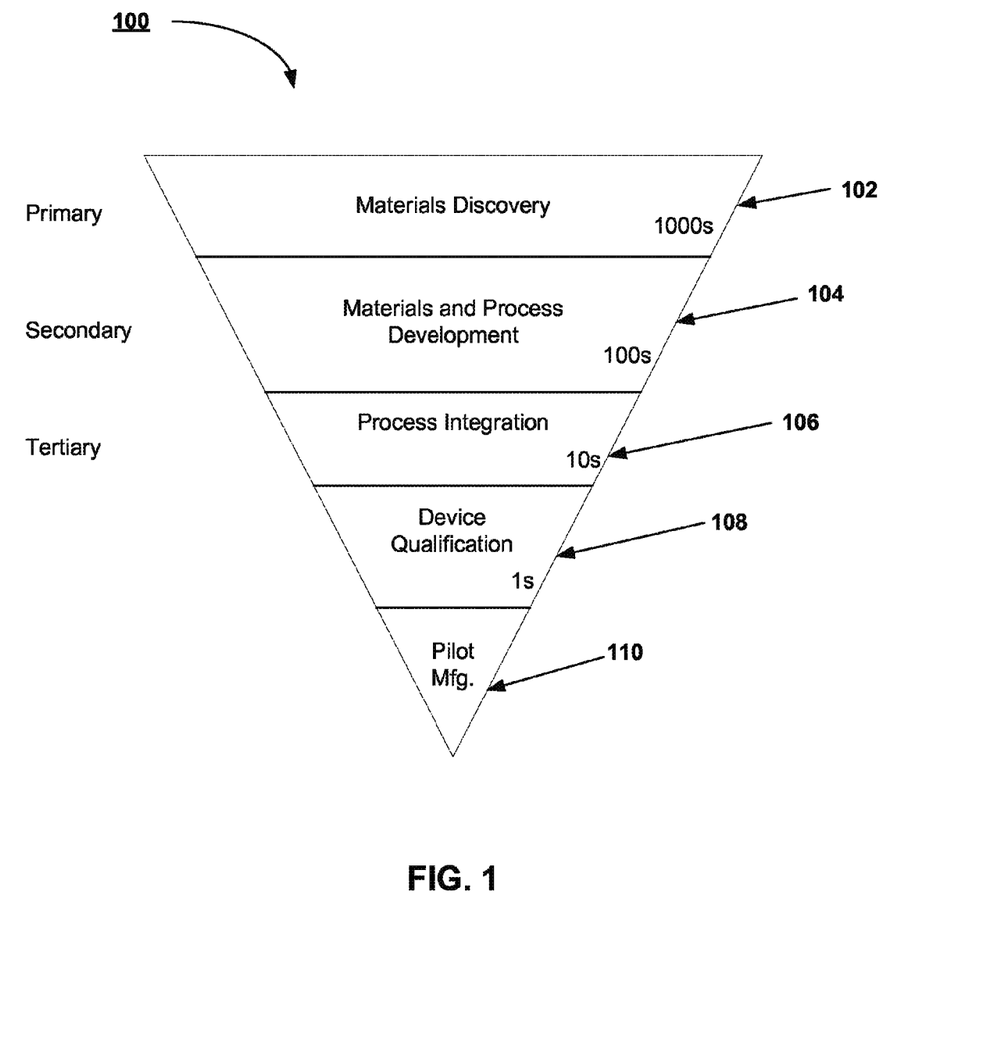
FIG. 1 illustrates a schematic diagram for implementing combinatorial processing and evaluation.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention.

While the combinatorial processing varies certain materials, hardware details, or process sequences, the composition or thickness of the layers or structures or the actions, such as cleaning, surface preparation, deposition, surface treatment, etc. is substantially uniform through each discrete region. Furthermore, while different materials or processes may be used for corresponding layers or steps in the formation of a structure in different regions of the substrate during the combinatorial processing, the application of each layer or use of a given process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
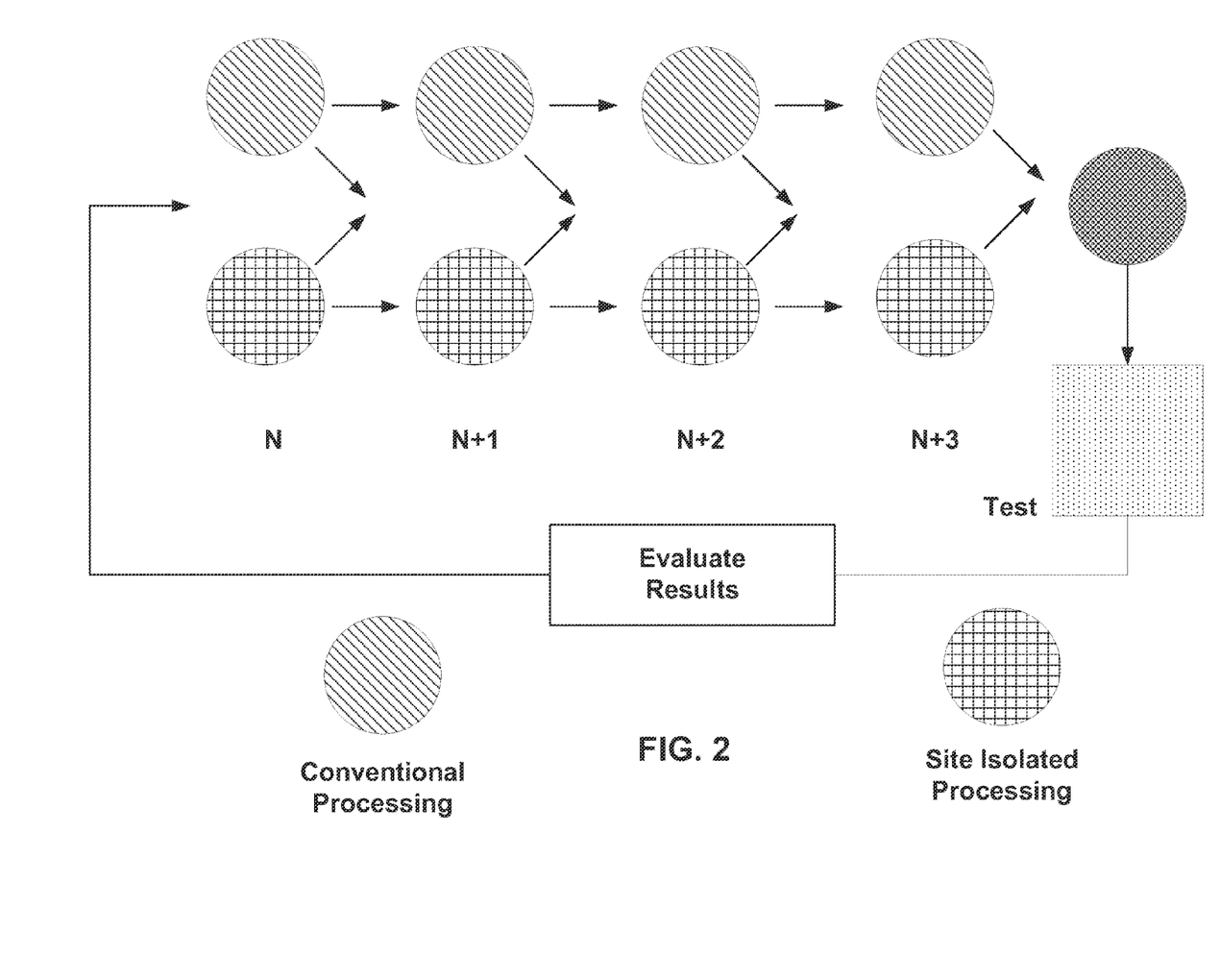
FIG. 2 presents a schematic diagram for illustrating various process sequences using combinatorial processing and evaluation.

FIG. 2 is a simplified schematic diagram illustrating a general methodology for combinatorial process sequence integration that includes site-isolated processing and/or conventional processing in accordance with one embodiment of the invention. In one embodiment, the substrate is initially processed using conventional process N. In one exemplary embodiment, the substrate is then processed using site-isolated process N+1. During site-isolated processing, an HPC module may be used, such as the HPC module described in U.S. patent application Ser. No. 11/352,077 filed on Feb. 10, 2006. The substrate can then be processed using site-isolated process N+2, and thereafter processed using conventional process N+3. Testing is performed and the results are evaluated. The testing can include physical, chemical, acoustic, magnetic, electrical, optical, etc. tests. From this evaluation, a particular process from the various site-isolated processes (e.g. from steps N+1 and N+2) may be selected and fixed so that additional combinatorial process sequence integration may be performed using site-isolated processing for either process N or N+3. For example, a next process sequence can include processing the substrate using site-isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above process flows can be applied to entire monolithic substrates, or portions of the monolithic substrates.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, the order in which materials are deposited, hardware details of the gas distribution assembly, etc. It should be appreciated that these process parameters are exemplary and not meant to be an exhaustive list as other process parameters commonly used with plasma exposure systems may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Substrates may be a conventional round 200 mm, 300 mm, or any other larger or smaller substrate/wafer size. In other embodiments, substrates may be square, rectangular, or other shape. One skilled in the art will appreciate that substrate may be a blanket substrate, a coupon (e.g., partial wafer), or even a patterned substrate having predefined regions. In some embodiments, a substrate may have regions defined through the processing described herein.

Software is provided to control the process parameters for each wafer for the combinatorial processing. The process parameters comprise selection of one or more source gases for the plasma generator, plasma filtering parameters, exposure time, substrate temperature, power, frequency, plasma generation method, substrate bias, pressure, gas flow, or combinations thereof.

Figure 3:
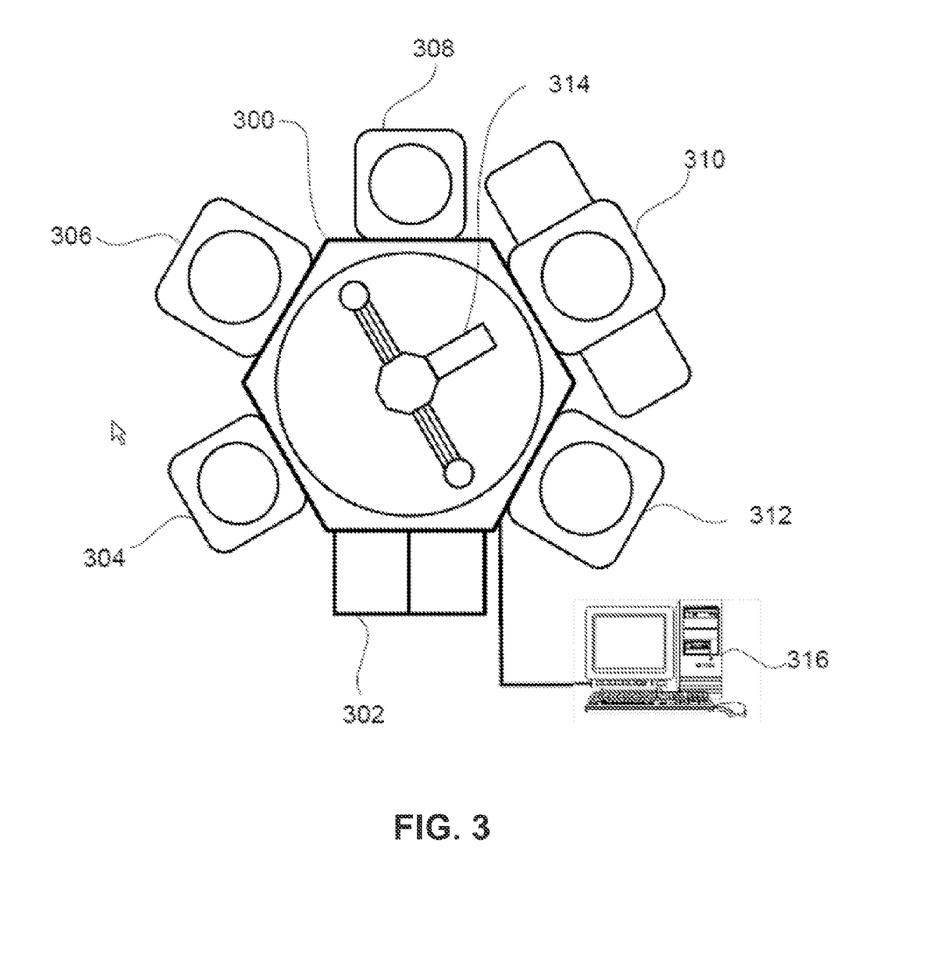
FIG. 3 illustrates a processing system enabling combinatorial processing.

FIG. 3 is a simplified schematic diagram illustrating an integrated high productivity combinatorial (HPC) system in accordance with some embodiments of the invention. The HPC system includes a frame 300 supporting a plurality of processing modules. It will be appreciated that frame 300 may be a unitary frame in accordance with some embodiments. In some embodiments, the environment within frame 300 is controlled. A load lock 302 provides access into the plurality of modules of the HPC system. A robot 314 provides for the movement of substrates (and masks) between the modules and for the movement into and out of the load lock 302. Modules 304-312 may be any set of modules and preferably include one or more combinatorial modules. For example, module 304 may be an orientation/degassing module, module 306 may be a clean module, either plasma or non-plasma based, modules 308 and/or 310 may be combinatorial/conventional dual purpose modules. Module 312 may provide conventional clean or degas as necessary for the experiment design.

Any type of chamber or combination of chambers may be implemented and the description herein is merely illustrative of one possible combination and not meant to limit the potential chamber or processes that can be supported to combine combinatorial processing or combinatorial plus conventional processing of a substrate or wafer. In some embodiments, a centralized controller, i.e., computing device 316, may control the processes of the HPC system. Further details of one possible HPC system are described in U.S. application Ser. Nos. 11/672,478 and 11/672,473, the entire disclosures of which are herein incorporated by reference. In a HPC system, a plurality of methods may be employed to deposit material upon a substrate employing combinatorial processes.

Plasmas are widely used for a variety of treatment, etching, and layer deposition (i.e. PECVD or PEALD) tasks in semiconductor fabrication. These applications include treatment processes such as oxidation, nitridation, or hydridation of a layer both during and after formation, subtractive processes such as wafer precleaning, contaminant removal, native oxide removal, photoresist removal, and deposition applications such as thin films, spacers, isolation materials, conductors, and the like. "Remote" plasma sources are frequently used, where the plasma is located at some distance from the surface to be treated or substrate on which a layer is to be formed. The distance allows some adjusting of the charged particles in the plasma. For example, the density of ions and electrons can be adjusted by distance, the electrons and ions can be removed from the generated plasma using suitable electrode configurations such as a grounded metal showerhead, so that, for example, only atomic radicals and molecule radicals (but not ions) reach the substrate. However, "direct" plasma sources can also be used, where the substrate is exposed to the plasma.

The plasma generator can use any known means of coupling energy into atoms or molecules to ionize them and create a plasma. The energy source can be, for example, electromagnetic energy such as microwaves, radio frequency energy, or lasers.

Typically, systems using plasma sources were designed to treat the entire area of a substrate, such as a 300 mm wafer. Combinatorial processing is difficult and expensive when the entire area of a substrate can only receive a single process variation. Some embodiments overcome this limitation by providing a plasma source, an associated substrate positioning system, and a site isolation system that allows a selected region of a substrate to be processed while the remaining regions of the substrate are protected from exposure to the plasma and reactive radical species unless or until such exposure is intended.

Accordingly, an apparatus for combinatorial processing using plasma exposure (e.g. PECVD or PEALD) of a substrate is disclosed. The apparatus comprises an outer chamber containing: a plasma source, an aperture allowing exposure of a site-isolated region of the substrate to plasma from the plasma source, and a transport system comprising a substrate support and capable of positioning the substrate such that the site-isolated region can be located anywhere on the substrate. The aperture has an area less than that of the substrate, so that a plurality of site-isolated regions on a single substrate can be exposed to a variety of plasma processing conditions. A barrier or barriers and a gas purge system operate to provide exposure to plasma and reactive radical species within the site-isolated region, preventing exposure of regions of the substrate outside the area exposed to plasma and reactive radical species through the aperture. The plasma exposure process parameters can be varied in a combinatorial manner. The plasma exposure process parameters comprise one or more of source gases for the plasma generator, plasma filtering parameters, exposure time, gas flow rate, frequency, plasma generator power, plasma generation method, chamber pressure, substrate temperature, distance between plasma source and substrate, substrate bias voltage, or combinations thereof.

In some embodiments, the apparatus further comprises an inner chamber, contained within the outer chamber and enclosing the substrate and the substrate support. A "process kit" can be defined comprising the inner chamber, substrate, and substrate support. The inner chamber comprises a top surface parallel to and in close proximity to the substrate, a bottom surface below the substrate support, and one or more side walls. The dimensions of the inner chamber parallel to the substrate are such that any desired region on the substrate can be positioned under the aperture, (i.e., there is sufficient space available in the inner chamber to accommodate the substrate and substrate support in any configuration necessary to provide access to the substrate through the aperture).

The aperture is preferably located in the top surface of the inner chamber with the barrier positioned near the edges of the aperture. The barrier can extend down from the top surface of the inner chamber toward the substrate, to provide more restriction to the flow of plasma and/or reactive radical species toward the remaining regions of the substrate. The barrier can be separated from the substrate by a small gap. The gap between the barrier and the substrate can be set to a distance of about 0.5 mm or less to exclude plasma and reactive radical species from reaching areas of the substrate outside the aperture and barrier. In some embodiments, the substrate support can comprise a substrate heater mounted in the substrate support for providing an independent temperature regulation as a process parameter that can be varied in a combinatorial manner.

The apparatus can include a gas purge system that comprises a plurality of flow outlets located at the edge of the substrate support. The gas purge system provides a gas flow into the site-isolated region through the small gap between the barrier and the substrate and out of the site-isolated region through the aperture, preventing plasma and/or reactive radical species from leaking past the barrier and affecting the protected regions of the substrate. The barrier or barriers and gas purge system can work together with the aperture to control exposure of plasma and reactive radical species to the substrate surface.

Figure 4:
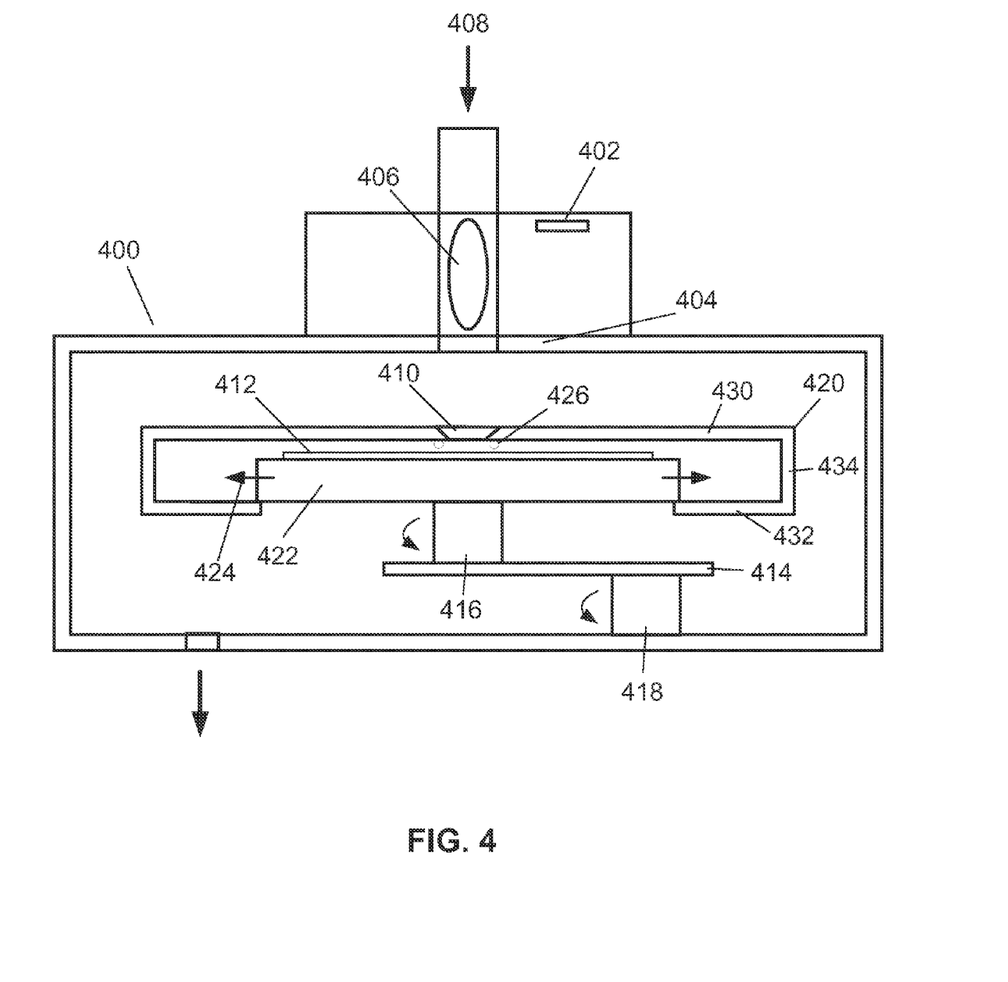
FIG. 4 illustrates an apparatus enabling combinatorial processing using PECVD or PEALD.

FIG. 4 illustrates the overall layout of some embodiments of a system enabling combinatorial processing using a plasma source. A discussion of the system may be found in co-owned U.S. patent application Ser. No. 13/328,129 filed on Dec. 16, 2011 which is herein incorporated by reference for all purposes. Portions of the '129 application are included herein to enhance the understanding of the present disclosure. An outer process chamber 400 is provided. A plasma source 402 is mounted on a chamber lid 404 either directly as illustrated or through a short flange. The plasma source 402 may be a remote plasma source or may be a direct plasma source. The configuration illustrated in FIG. 4 corresponds to a remote plasma source. The plasma 406 is entrained into a central gas flow 408 which is directed toward an aperture 410. The aperture is in close proximity to a substrate 412. A substrate positioning system 414 can position any region on the substrate 412 directly under the aperture 410. As illustrated in FIG. 4, the substrate positioning system can provide two displaced axes of rotation 416 and 418. The two-axis rotation configuration illustrated can provide 360° of rotation for the upper rotation (providing an angular coordinate) and 60° of rotation for the lower axis (approximating a radial coordinate) to provide all possible substrate positions. Alternatively, other positioning systems such as X-Y translators can also be used. In addition, substrate support 422 may move in a vertical direction. It should be appreciated that the rotation and movement in the vertical direction may be achieved through known drive mechanisms which include magnetic drives, linear drives, worm screws, lead screws, a differentially pumped rotary feed through drive, etc.

An inner chamber (also called a "process kit") 420 provides an enclosure for the substrate 412 and the substrate support 422. Substrate support 422 can be configured to hold a substrate 412 thereon, and can be any known substrate support, including but not limited to a vacuum chuck, electrostatic chuck, or other known mechanisms. The shape can be selected to conveniently enclose the substrate and substrate support in all positions used; for example, it can be cylindrical. The inner chamber 420 comprises a top surface 430 parallel to the substrate 412, a bottom surface 432 below the substrate support 422, and one or more side walls 434. The top surface 430 need not be positioned close the substrate surface. The substrate 412 is shown mounted on substrate support 422. The inner chamber 420 is typically made from a material such as quartz or ceramic that is mechanically and chemically stable at process temperatures. The inner chamber 420 can be made of two different materials, with a center portion made of quartz or ceramic, and the edge portion made of metal. The X-Y extent of the inner chamber 420 is large enough to accommodate the substrate 412 in any position that can be achieved using the substrate positioning system.

The substrate support 422 can include a substrate heater (e.g., resistive or inductive) and can be sized to be larger than the largest substrate to be processed. Substrate temperatures for most plasma applications are less than 500 C, although any suitable heater power and range of temperature control. The substrate support 422 can also be configured to provide a gas purge flow 424, for example from the edges of the support, using argon, helium, or any other gas that is not reactive under the process conditions.

The aperture 410 defines the area of a site-isolated region where exposure to a plasma or reactive species occurs. Barrier 426 near the edges of the aperture provides control over plasma exposure, and serves to restrict plasma or reactive radical species access to regions outside the area immediately under the aperture 410. The position, shape, and height of barrier 426 can be chosen to provide maximal protection of areas of the substrate 412 for which plasma exposure is not desired. Barrier 426 can be made from a high-temperature O-ring material such as KALREZ® fluoropolymer or a refractory material such as quartz or ceramic. In some embodiments, the barrier is circular; the barrier does not have to be any particular shape, but most generally is compatible with the shape of the aperture 410. The barrier 426 can be positioned with a small gap (typically less than 0.5 mm) to the substrate 412, and the gas purge flow 424 can be adjusted so that any gas leakage under the barrier 426 is directed into the site-isolated region and out through the aperture 410.

The aperture shape and size can be varied according to the needs of particular combinatorial experiments. Typical shapes are round, square, or rectangular with linear extents of about 10 to about 25 mm, although other shapes and sizes are possible, for example about 1 to about 65 mm. Further experimental design flexibility can be provided by using patterned apertures with multiple openings.

Figure 5:
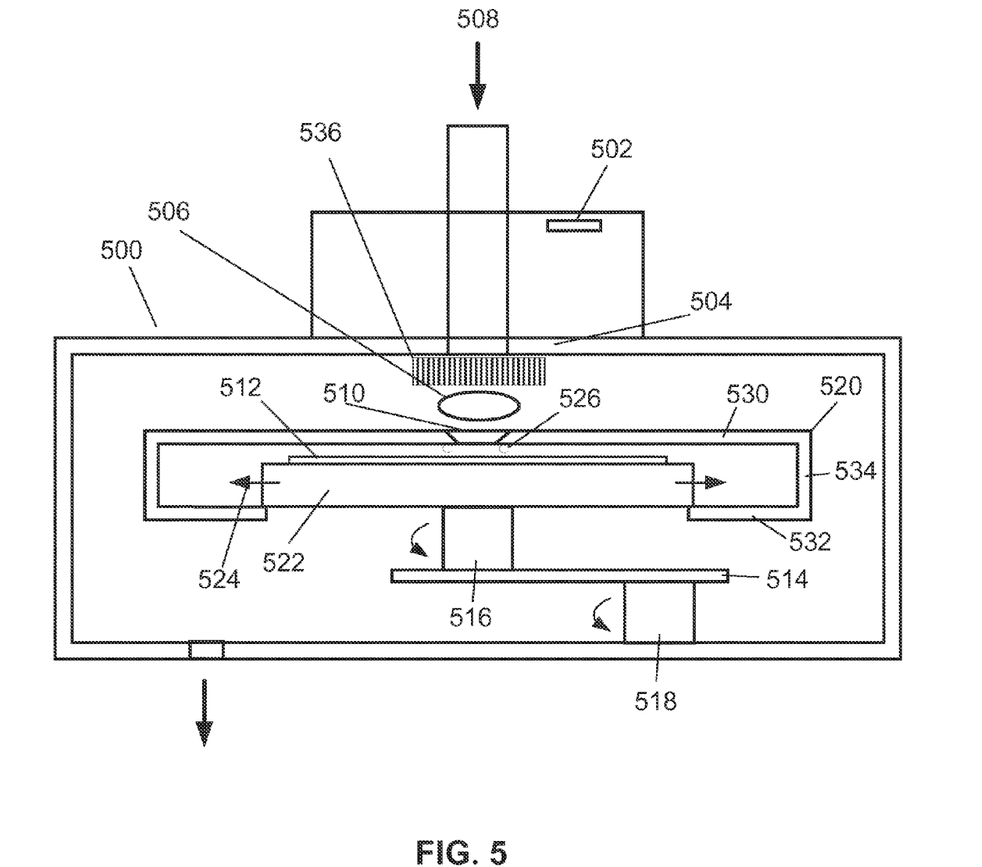
FIG. 5 illustrates an apparatus enabling combinatorial processing using PECVD or PEALD.

FIG. 5 illustrates the overall layout of some embodiments of a system enabling combinatorial processing using a plasma source. An outer process chamber 500 is provided. A plasma source 502 is mounted on a chamber lid 504 either directly as illustrated or through a short flange. The plasma source 502 may be a remote plasma source or may be a direct plasma source. The configuration illustrated in FIG. 5 corresponds to a direct plasma source. The plasma 506 is formed between a showerhead 536 and an inner chamber 520 including an aperture 510. The showerhead serves to distribute the gases 508 evenly across the region of the inner chamber that includes the aperture. The plasma may be ignited by applying power to either the showerhead or the substrate support. The aperture is in close proximity to a substrate 512. A substrate positioning system 514 can position any region on the substrate 512 directly under the aperture 510. As illustrated in FIG. 5, the substrate positioning system can provide two displaced axes of rotation 516 and 518. The two-axis rotation configuration illustrated can provide 360° of rotation for the upper rotation (providing an angular coordinate) and 60° of rotation for the lower axis (approximating a radial coordinate) to provide all possible substrate positions. Alternatively, other positioning systems such as X-Y translators can also be used. In addition, substrate support 522 may move in a vertical direction. It should be appreciated that the rotation and movement in the vertical direction may be achieved through known drive mechanisms which include magnetic drives, linear drives, worm screws, lead screws, a differentially pumped rotary feed through drive, etc.

An inner chamber (also called a "process kit") 520 provides an enclosure for the substrate 512 and the substrate support 522. Substrate support 522 can be configured to hold a substrate 512 thereon, and can be any known substrate support, including but not limited to a vacuum chuck, electrostatic chuck, or other known mechanisms. The shape can be selected to conveniently enclose the substrate and substrate support in all positions used; for example, it can be cylindrical. The inner chamber 520 comprises a top surface 530 parallel to the substrate 512, a bottom surface 532 below the substrate support 522, and one or more side walls 534. The top surface 530 need not be positioned close the substrate surface. The substrate 512 is shown mounted on substrate support 522. The inner chamber 520 is typically made from a material such as quartz or ceramic that is mechanically and chemically stable at process temperatures. The inner chamber 520 can be made of two different materials, with a center portion made of quartz or ceramic, and the edge portion made of metal. The X-Y extent of the inner chamber 520 is large enough to accommodate the substrate 512 in any position that can be achieved using the substrate positioning system.

The substrate support 522 can include a substrate heater (e.g., resistive or inductive) and can be sized to be larger than the largest substrate to be processed. Substrate temperatures for most plasma applications are less than 500 C, although any suitable heater power and range of temperature control. The substrate support 522 can also be configured to provide a gas purge flow 524, for example from the edges of the support, using argon, helium, or any other gas that is not reactive under the process conditions.

The aperture 510 defines the area of a site-isolated region where exposure to a plasma or reactive species occurs. Barrier 526 near the edges of the aperture provides control over plasma exposure, and serves to restrict plasma or reactive radical species access to regions outside the area immediately under the aperture 510. The position, shape, and height of barrier 526 can be chosen to provide maximal protection of areas of the substrate 512 for which plasma exposure is not desired. Barrier 526 can be made from a high-temperature O-ring material such as KALREZ® fluoropolymer or a refractory material such as quartz or ceramic. In some embodiments, the barrier is circular; the barrier does not have to be any particular shape, but most generally is compatible with the shape of the aperture 510. The barrier 526 can be positioned with a small gap (typically less than 0.5 mm) to the substrate 512, and the gas purge flow 524 can be adjusted so that any gas leakage under the barrier 526 is directed into the site-isolated region and out through the aperture 510.

The aperture shape and size can be varied according to the needs of particular combinatorial experiments. Typical shapes are round, square, or rectangular with linear extents of about 10 to about 25 mm, although other shapes and sizes are possible, for example about 1 to about 65 mm. Further experimental design flexibility can be provided by using patterned apertures with multiple openings.

Figure 6:
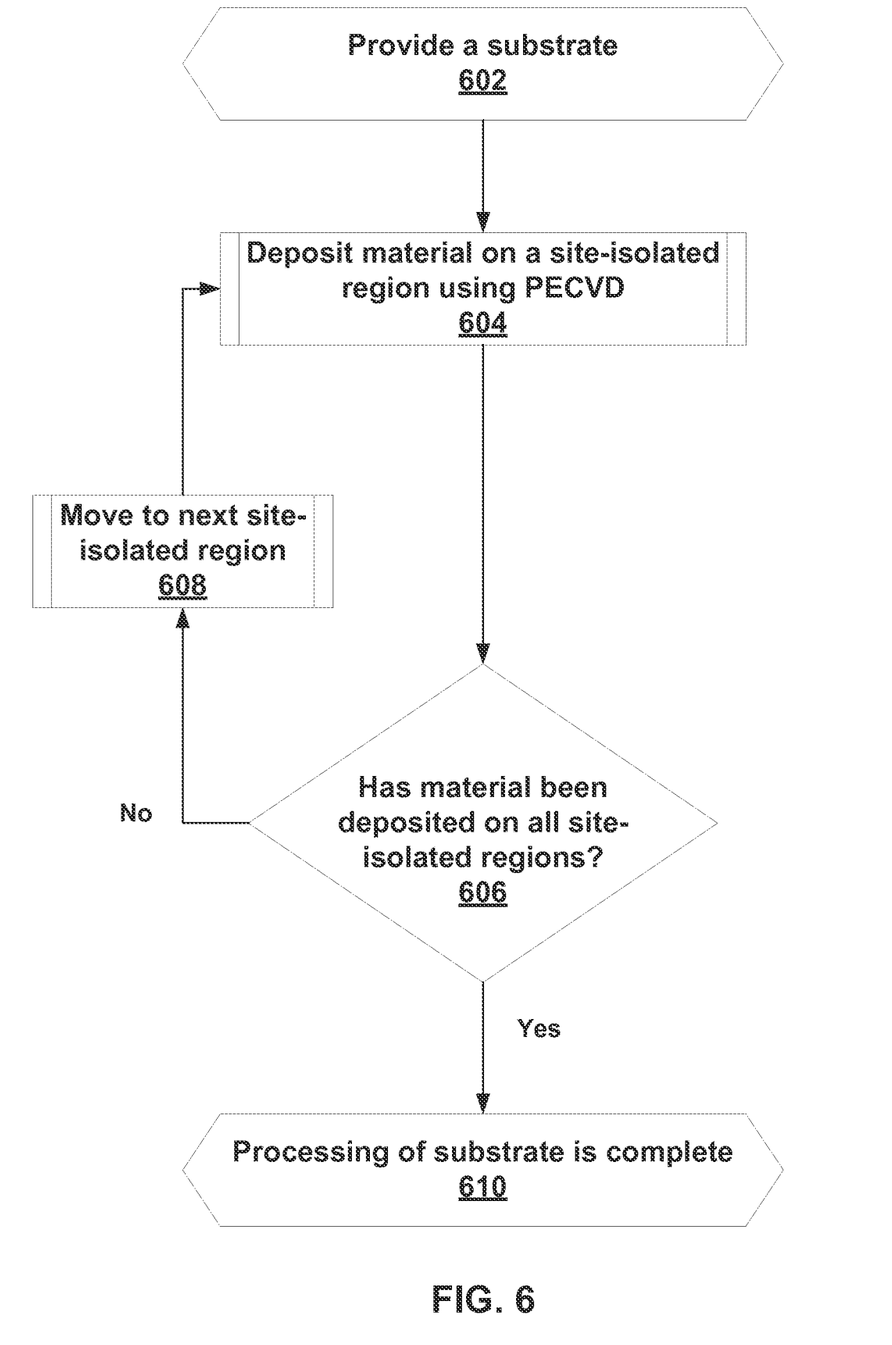
FIG. 6 presents a flow chart illustrating the steps of methods according to some embodiments.

In some embodiments, methods of combinatorially depositing materials by PECVD are provided. The methods are illustrated in FIG. 6. In step 602 a substrate is provided. The methods comprise depositing material on a site-isolated region of the substrate using PECVD or PEALD under a first set of process parameters in step 604. Step 606 determines if material has been deposited on all of the site-isolated regions. If not, then the substrate is moved 608 to expose a new site-isolated region to the aperture as discussed previously. Step 604 is repeated to deposit material on a second site-isolated region of the substrate using PECVD or PEALD under a second set of process parameters. During each deposition, the remaining area (the unexposed area) of the substrate is protected from exposure to the plasma or reactive species. The process parameters can be varied in a combinatorial manner. Typically, the process parameters comprise one or more of source gases for the plasma generator, plasma filtering parameters, exposure times, gas flow rates, frequencies, plasma generator powers, plasma generation methods, chamber pressures, substrate temperatures, distances between plasma source and substrate, substrate bias voltages, or combinations thereof. This sequence is repeated until material has been deposited on all of the site-isolated regions on the substrate 610. After material has been deposited on all of the site-isolated regions of the substrate under different PECVD or PEALD processing parameters, the substrate is analyzed to evaluate the effect of the different process parameters on the material deposited in each of the site-isolated regions.

Process times for deposition can vary. Typical process times vary from a few seconds to a few minutes. In some embodiments, the process times are preferably set by turning the plasma generator on and off. In some embodiments, the plasma generator is left on, and a shutter can be opened to start exposure, and the shutter can be closed to stop exposure. The shutter can be located anywhere between the plasma source 402/502 and the aperture 410/510.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method of depositing material on a substrate in a combinatorial manner, the method comprising:
   providing a substrate comprising a plurality of site-isolated regions, wherein the plurality of site-isolated regions comprises a first site-isolated region and a second site-isolated region,
wherein a size of each of the plurality of site-isolated regions is determined by an aperture in a plate,
wherein the plate comprising the aperture is disposed between a plasma source and the substrate,
wherein the aperture has an area less than that of the substrate,
positioning the each of the plurality of site-isolated regions directly under the aperture using a substrate positioning system,
wherein the substrate positioning system comprises two displaced axes of rotation and a substrate support,
wherein the two displaced axes of rotation comprise an upper rotation axis and a lower rotation axis;
wherein the upper rotation axis comprises 360° of rotation, providing a first set of angular coordinates for the first site-isolated region and a second set of angular coordinates for the second site-isolated region,
wherein the lower rotation axis comprises 60° of rotation, approximating a first set of radial coordinates for the first site-isolated region and a second set of radial coordinates for the second site-isolated region, and
wherein the substrate support holds the substrate and moves the substrate in a vertical direction;
depositing a first material on the first site-isolated region using plasma enhanced chemical vapor deposition (PECVD) or plasma enhanced atomic layer deposition (PEALD) under a first set of process parameters;
varying the first set of process parameters in a combinatorial manner to yield a second set of process parameters; and
depositing a second material on the second site-isolated region using PECVD or PEALD under the second set of process parameters;
wherein at least one of the depositing a first material or the depositing a second material is further controlled by placing a barrier at an edge of the aperture,
wherein the barrier extends from the plate toward a surface of the substrate, and
wherein the barrier is separated from the surface of the substrate by a gap.

2. The method of claim 1, wherein the first set of process parameters and the second set of process parameters each comprise at least one of source gases for a plasma generator, plasma filtering parameters, exposure time, gas flow rate, frequency, plasma generator power, plasma generation method, chamber pressure, substrate temperature, distance between plasma source and substrate, substrate bias voltage, or combinations thereof.

3. The method of claim 1, wherein at least one of the depositing a first material or the depositing a second material is further controlled by a gas purge system,
wherein the gas purge system provides a flow of gas into the plurality of site-isolated regions through the gap, and
wherein the gas purge system provides removal of the gas out of the plurality of site-isolated regions through the aperture.

4. The method of claim 1, further comprising
varying the second set of process parameters in a combinatorial manner to yield a third set of process parameters; and
depositing a third material on a third site-isolated region using PECVD or PEALD under the third set of process parameters.

5. The method of claim 1, further comprising depositing a plurality of materials on a plurality of site-isolated regions using PECVD or PEALD under a plurality of different sets of process parameters.

6. The method of claim 5, wherein the substrate is analyzed to evaluate the effect of the plurality of different sets of process parameters on the material deposited within the each of the plurality of site-isolated regions.

7. The method of claim 3, wherein the flow of gas provided by the gas purge system comprises one of argon or helium.

8. The method of claim 1, wherein the gap is less than about 0.5 mm.

9. The method of claim 1, wherein the depositing a first material on a first site-isolated region using PECVD or PEALD under a first set of process parameters, further comprises heating the substrate to a target temperature using a substrate heater,
wherein the first set of process parameters includes substrate temperature, and
wherein the substrate heater is attached to the substrate support.

10. The method of claim 9, wherein the target temperature is less than 500° C.

11. The method of claim 1, wherein the barrier comprises KALREZ® fluoropolymer.

12. The method of claim 1, wherein the barrier comprises one of quartz or ceramic.

13. The method of claim 1, wherein the aperture has a shape that is one of round, square, or rectangular.

14. The method of claim 13, wherein the aperture shape is square or rectangular and comprises linear extents of about 1 mm to about 65 mm.

15. The method of claim 14, wherein the linear extents are about 10 mm to about 25 mm.

16. The method of claim 1, wherein the aperture is a patterned aperture comprising multiple openings.

17. The method of claim 1, wherein the substrate support moves the substrate in a vertical direction using a drive mechanism that is one of a magnetic drive, linear drive, worm screw, lead screw, or a differentially pumped rotary feed through drive.

18. The method of claim 1, wherein the substrate support is one of a vacuum chuck or electrostatic chuck.

19. The method of claim 1, wherein the first set of process parameters includes process times for the depositing a first material, and the process times are set by turning a plasma generator on or off.

20. The method of claim 1, wherein the first set of process parameters includes process times for the depositing a first material, and setting the process times comprises
using a plasma generator as a plasma source for the depositing a first material, wherein the plasma generator is always on and plasma is continuously being generated, and
using a shutter to control an exposure of the plasma,
wherein the shutter is opened to start exposure of the plasma and the shutter is closed to stop the exposure,
wherein the shutter is located between the plasma generator and the aperture.

* * * * *